United States Patent [19]
Poinelli et al.

[11] Patent Number: 5,617,295
[45] Date of Patent: Apr. 1, 1997

[54] LEADFRAME FOR SUPPORTING INTEGRATED SEMICONDUCTOR DEVICES

[75] Inventors: Renato Poinelli, Casatenovo; Mauro Mazzola, Treviglio; Paolo Casati, Sesto, all of Italy

[73] Assignee: SGS-Thomson Microelectronics, S.R.L., Agrate Brianza Mi, Italy

[21] Appl. No.: 414,285

[22] Filed: Mar. 31, 1995

[51] Int. Cl.$^6$ .................................................. H05K 7/20
[52] U.S. Cl. .......................... 361/723; 257/675; 361/707
[58] Field of Search ................................. 165/80.3, 185; 174/51, 52.2, 52.4, 252, 16.3; 257/666, 675, 706, 707, 713; 361/688–690, 702–704, 707, 709–712, 723, 776

[56] References Cited

U.S. PATENT DOCUMENTS

| | | | |
|---|---|---|---|
| 3,984,166 | 10/1976 | Hutchison | 339/17 CF |
| 4,949,220 | 8/1990 | Tashiro | 361/386 |
| 5,025,114 | 6/1991 | Bruden | 174/52.4 |
| 5,229,918 | 7/1993 | Bosca | 361/388 |
| 5,298,464 | 3/1994 | Schlesinger | 437/216 |
| 5,404,273 | 4/1995 | Akagawa | 361/707 |
| 5,410,451 | 4/1995 | Hawthorne | 361/760 |
| 5,459,639 | 10/1995 | Izumi | 361/707 |

*Primary Examiner*—Gerald P. Tolin
*Attorney, Agent, or Firm*—Felsman, Bradley, Gunter & Dillon, LLP

[57] ABSTRACT

A leadframe for electronic semiconductor devices incorporates one or two metal bars fastened to a heat dissipator by electroconductive means.

Each bar has a metallized area for the electric connection, by means of a bonding wire, with a semiconductor chip placed on the dissipator.

According to the present invention, the metallized areas are lowered in relation to the upper surface of the metal bar, so that lead frames can be stacked, during packing and transportation, directly on each other without danger of damaging the metallized areas.

9 Claims, 2 Drawing Sheets

LEADFRAME FOR SUPPORTING INTEGRATED SEMICONDUCTOR DEVICES

BACKGROUND OF THE INVENTION

1. Field of the Invention

The present invention relates to electronic semiconductor devices and specifically a structure of such a device comprising a heat dissipator and a plastic body joined to the dissipator and from which protrude the terminal leads of the device.

2. Description of the Prior Art

As known, integrated circuits are provided on semiconductor chips and require for their connection to an outside electrical circuit special support structures for containment and electrical connection.

A typical structure suited for the purpose consists essentially of a plastic body (termed package) enclosing the chip which is connected by means of thin metal wires welded on special metallized areas provided on its surface to corresponding electrical conductors—or terminal leads—emerging from the plastic body.

In the case of integrated power circuits, i.e. devices designed for operation with high currents and, therefore, capable of producing heat, said structures also comprise a metallic dissipator element through which the chip fastened thereon can transfer to the exterior the heat produced during its operation.

For the fabrication of these packages, on the dissipator is mounted a frame consisting of metallic strips still joined together by interconnection lengths and designed to become the terminal leads of the device. Said framework is made by blanking from a copper sheet and exhibits holes opposite special columns integral with the dissipator.

The free ends of these columns are riveted at the time the framework is positioned and constrained on the dissipator to ensure electrical connection between the dissipator and the frame. Typically the unit formed by the dissipator and the metal framework joined together is repeated a certain number of times to form a continuous metallic strip. This structure is termed "leadframe".

Then the chip is fastened on the dissipator by welding with a low boiling-point alloy, e.g. lead-tin alloy, or by cementing with a suitable adhesive, e.g. an epoxy glue.

Thin gold wires are welded on one end to the peripheral terminals (pads) of the chip and on the other end to the internal end of the metallic strips by a process termed "thermosonic" which provides the simultaneous application of heat and ultrasounds.

In certain cases it is required that at least one of the pads of the chip, normally connected to the electrical ground of the circuit, be electrically connected to the dissipator. The connection is established as described in European patent application of the same applicant no. 92115760.8 published 9 Jun. 1993 under no. 0545007 with a thin gold wire fastened on one end to the metallized area of the chip and at the other end to special pads made on the surface of the metal framework.

Subsequently the assembly is mounted in a special mould in which is injected a plastic resin in liquid state. After polymerisation of the resin there is obtained a structure comprising a solid plastic body incorporating the above described elements with the exception of one face of the dissipator, part of the terminal leads of the device, and the interconnection lengths between the terminal leads. These interconnection lengths are then eliminated by blanking and there is obtained thus the finished device.

Normally the leadframes are produced in a place different from where the entire device is assembled or where processing steps are performed, discussed above, and which lead to blanking of the interconnection lengths between the terminal leads and between the leadframes themselves.

These leadframes are inserted by stacking a certain number of identical parts in special containers designed for transportation and are shipped to the place where processing of the device continues. In these containers the leadframes are rested on each other and thus the top face of each leadframe is in contact with the bottom face of the leadframe above.

As the surfaces of some pads designed for electrical connection of some areas of the semiconductor chip with the dissipator are metallized with silver it may happen that during packing and transportation operations, because of mutual rubbing of the leadframes, said surfaces are partially damaged. This may cause defects during the subsequent processing steps and reduce considerably the reliability of the welding.

A contrivance used to protect the metallized areas on the surface of the leadframes consists of placing between one leadframe and the next protective spacers made of shock-resistant material.

A first shortcoming encountered when using this type of packing is the need to remove the spacers one by one before loading the leadframes in the assembly machines of the semiconductor chips and welding of the connecting thin gold wires. In addition, these spacers having a certain thickness, the dimensions of the containers used for transportation are much greater than the actual volume occupied by the leadframes.

It is therefore an object of the present invention to conceive, for electronic semiconductor devices, a leadframe having structural and functional characteristics such as to overcome the shortcomings encountered in the prior art.

The characteristics and advantages of the leadframe in accordance with the present invention are set forth in the description of an embodiment thereof given below by way of non-limiting example with reference to the annexed drawings.

SUMMARY OF THE INVENTION

A leadframe for electronic semiconductor devices incorporates one or two metal bars fastened to a heat dissipator by electroconductive means.

Each bar has a metallized area for the electric connection, by means of a bonding wire, with a semiconductor chip placed on the dissipator.

According to the present invention, the metallized areas are lowered in relation to the upper surface of the metal bar, so that lead frames can be stacked, during packing and transportation, directly on each other without danger of damaging the metallized areas.

DETAILED DESCRIPTION OF THE PREFERRED EMBODIMENT

With reference to the figures the structure of the electronic semiconductor device shown in the various figures comprises a solid plastic body indicated by reference number 9, a multiplicity of metal strips or terminal leads 6, a dissipator 2 with the function of support and heat dissipation and a semiconductor chip 8 in which is formed an integrated circuit and which is fastened to the dissipator by a layer of welding alloy.

Figure 2:
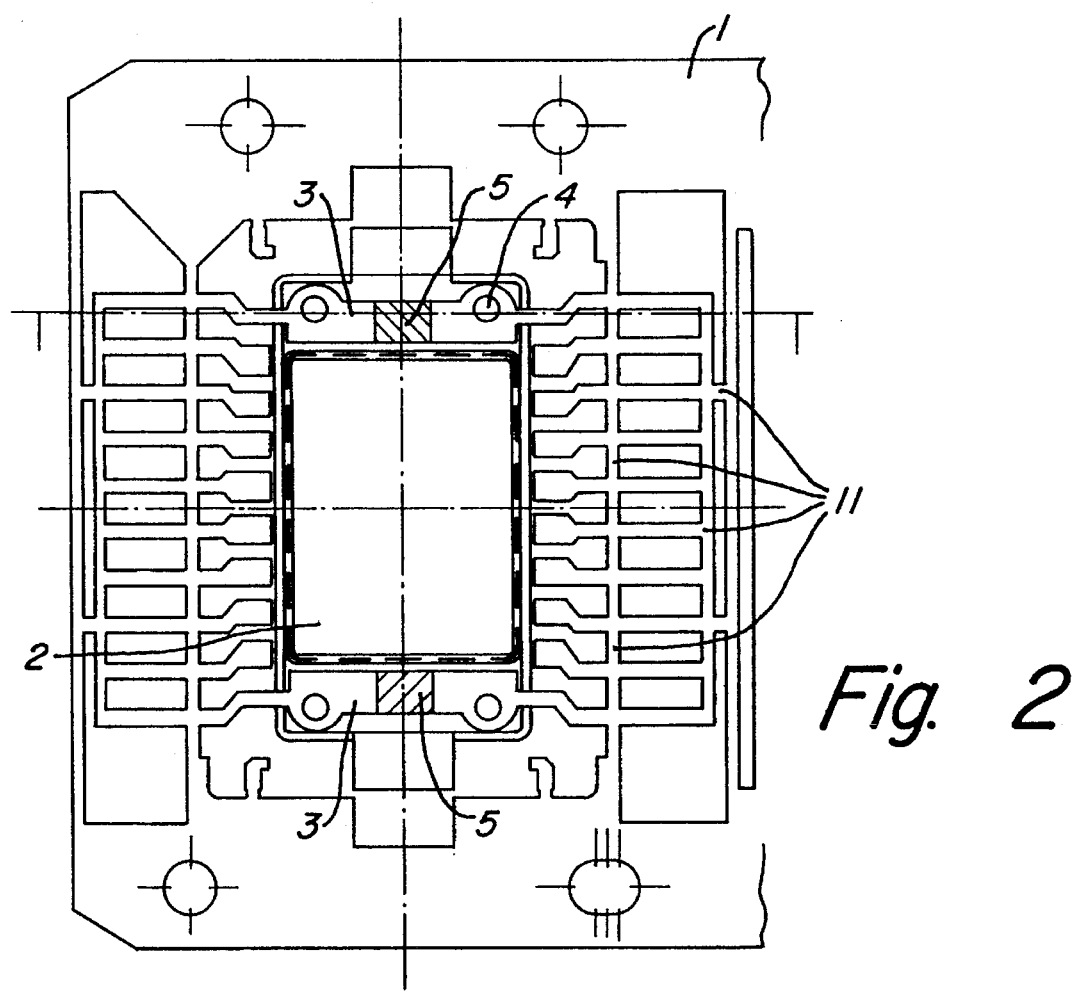
FIG. 2 shows a plan view of part of a leadframe in accordance with the present invention.

The terminal leads 6 are made in the usual manner by blanking from a single piece of sheet metal and, before being completely separated from each other after forming, preferably before blanking, are joined together by interconnection lengths 11 so as to constitute together a framework indicated as a whole by reference number 1 as may be seen in FIG. 2.

The ends of the leads inside the framework 1 are connected in the known manner described above to the metallized areas 7 of the semiconductor chip 8 by means of thin gold wires 10. The framework 1 exhibits two opposing side strips made by blanking from the same metal sheet and which form two bars 3 inside the plastic body.

The bars in accordance with the embodiment shown in the drawing extend outside the body in narrower parts quite similar to the terminal leads 6. Each bar 3 has two holes which allow mounting of the framework 1 on the dissipator 2 by means of special columns 4 integral with the dissipator.

The columns are of electrically conductive material and are preferably made by drawing from the dissipator simultaneously with the blanking operation by which is formed the dissipator itself. After insertion of the columns 4 in the holes, the columns 4 are upset to fasten in position the bars 3 and the entire framework 1.

Two metallized areas 7 of the semiconductor chip 8 corresponding to the electric ground terminal of the integrated circuit are connected by respective thin gold wires 10 to special areas 5 made on the bars 3 in the areas intermediate between the supporting columns 4. The areas 5 made on the bars 3 are metallized with silver to prevent their oxidation and improve welding quality.

Figure 3:
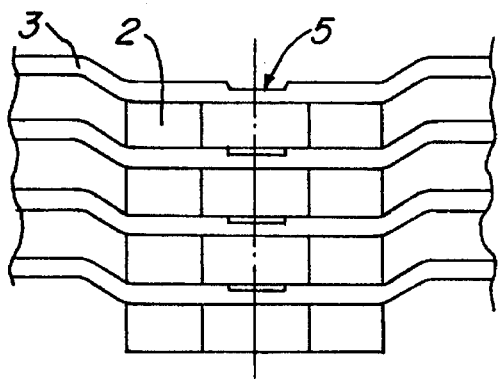
FIG. 3 shows a cross section of four leadframes in accordance with the present invention superimposed one on the others.

In addition the surface of said areas 5 is lowered as may be seen from the cross section of FIG. 3 in relation to the upper surface of the bars 3. These lowered areas are made by pressing on the metal sheet simultaneously with the blanking operation by which the leadframe is formed. By a subsequent operation these lowered areas are metallized with silver.

In this manner the ground connection of the integrated circuit with the heat dissipator 2 is assured.

Figure 1:
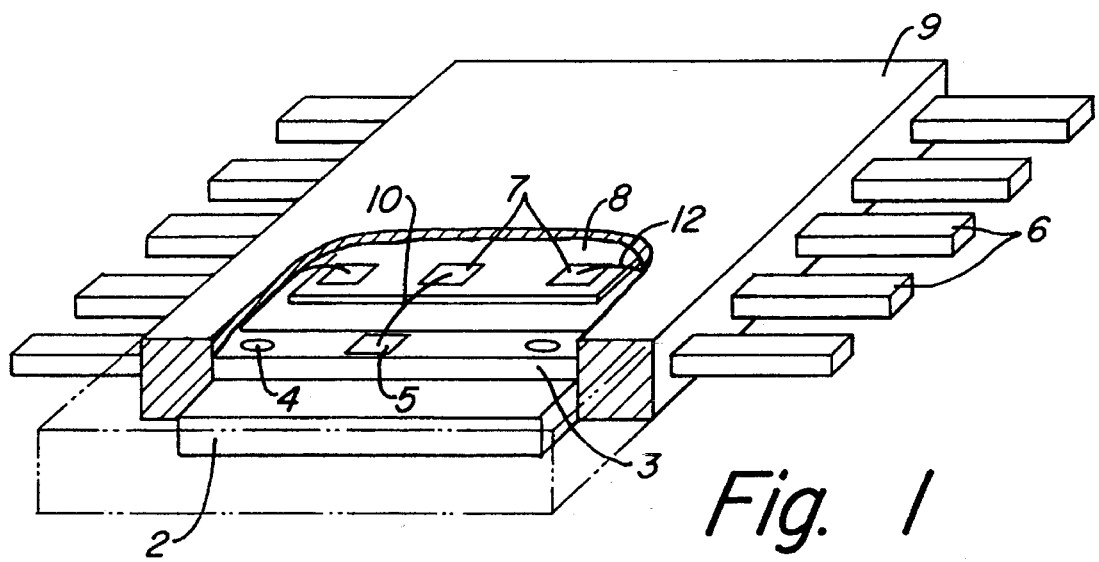
FIG. 1 shows a perspective view of an electronic semiconductor device incorporating a supporting frame in accordance with the present invention with a part removed to show its interior.

Formation of the plastic body 9 and blanking of the interconnection lengths 11 of the framework 1 are performed in the usual manner so as to obtain the structure shown in FIG. 1 which appears externally quite similar to the usual support and containment structures of integrated circuits.

Figure 4:
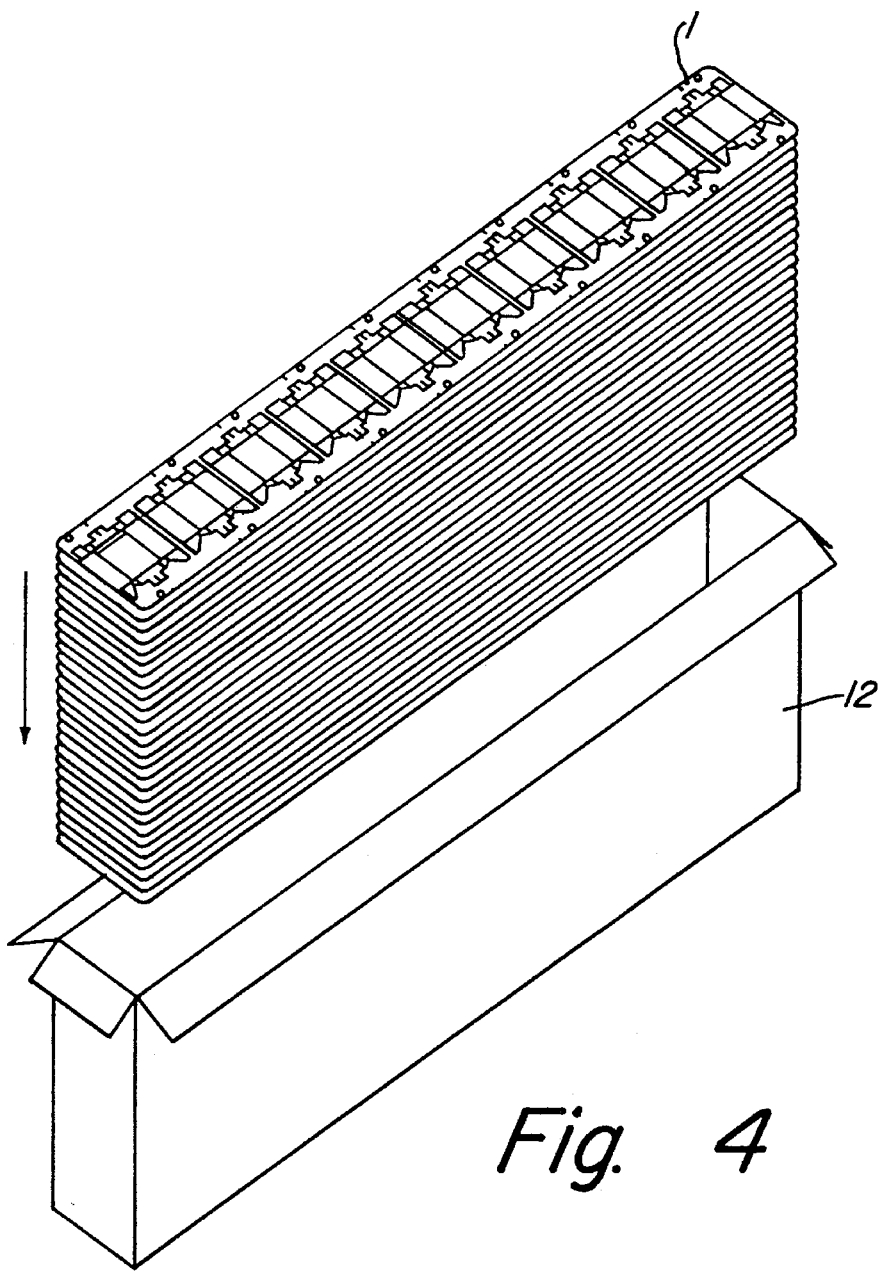
FIG. 4 shows a perspective view of a series of leadframes in accordance with the present invention as they are inserted in the containers for transportation.

Lowering of the metallized areas 5 in relation to the surface of the metal bars 3 permits, during packing and transportation thereof, stacking of the leadframes directly on each other as shown in FIG. 4 without danger of damaging the metallized areas. In this manner there is avoided the use of shock-resistant spacers placed between the leadframes and which must be removed one by one before loading of the leadframes in the machines used in the subsequent electronic semiconductor device assembly operations.

The leadframes provided in accordance with the present invention thus permit reduction of the dimensions of the containers 12 designed for transportation and also permit direct loading of the leadframes from the containers to the chip welding machines.

Of course modifications and variations can be made to the device described above by way of nonlimiting example all however falling within the protective scope of the following claims. For example the bars might not have the external extensions to the plastic body, i.e. they might be completely incorporated in the plastic body or there might be provided a single bar instead of two or each bar could have more than one lowered and metallized area.

I claim:

1. A packaged electronic semiconductor device comprising:

a heat dissipator having a peripheral boundary;

a semiconductor chip fastened on the dissipator and having on its surface electrical terminals;

a metal bar having a metallized area fastened to the heat dissipator by electroconductive means;

a plurality of conductive leads each having one end adjacent to the semiconductor chip;

connecting wires connected between the electrical terminals of the semiconductor chip and said ends of the conductive leads;

connecting wires connected between an electrical terminal of the semiconductor chip and the metallized area on the metal bar; and resin shell surrounding the semiconductor chip and the ends of the conductive leads adjacent the semiconductor chip;

wherein said metallized area is lowered in relation to a top surface of the metal bar.

2. The packaged electronic semiconductor device of claim 1 wherein an end of the metal bar extends outside the peripheral boundary of the heat dissipator and forms a terminal lead of the packaged electronic semiconductor device.

3. The packaged electronic semiconductor device of claim 1, wherein two ends of the metal bar extend outside the peripheral boundary of the dissipator and form terminal leads of the packaged electronic semiconductor device.

4. The packaged electronic semiconductor device of claim 1 further comprising a second opposing metal bar extending parallel to the first bar, each one near opposing sides of the dissipator.

5. The packaged electronic semiconductor device of claim 4, wherein an end of at least one of the metal bars extends outside the peripheral boundary of the dissipator and forms terminal leads of the packaged electronic semiconductor device.

6. The packaged electronic semiconductor device of claim 4, wherein two ends of at least one of the metal bars extend outside the peripheral boundary of the dissipator and form terminal leads of the packaged electronic semiconductor device.

7. The frame of claim 1, wherein two ends of the metal bar extend outside the peripheral boundary of the dissipator and form terminal leads of the leadframe.

8. The frame of claim 4, wherein an end of at least one of the metal bars extends outside the peripheral boundary of the dissipator and forms a terminal lead of the leadframe.

9. The frame of claim 4, wherein two ends of at least one of the metal bars extend outside the peripheral boundary of the dissipator and form terminal leads of the leadframe.

* * * * *